(12) United States Patent
Ito et al.

(10) Patent No.: US 6,956,186 B1
(45) Date of Patent: Oct. 18, 2005

(54) CERAMIC HEATER

(75) Inventors: Yasutaka Ito, Gifu (JP); Yasuji Hiramatsu, Gifu (JP)

(73) Assignee: Ibiden Co., Ltd., Ogaki (JP)

(*) Notice: Subject to any disclaimer, the term of this patent is extended or adjusted under 35 U.S.C. 154(b) by 21 days.

(21) Appl. No.: 10/049,293

(22) PCT Filed: Aug. 1, 2000

(86) PCT No.: PCT/JP00/05155

§ 371 (c)(1), (2), (4) Date: Apr. 30, 2002

(87) PCT Pub. No.: WO01/11919

PCT Pub. Date: Feb. 15, 2001

(30) Foreign Application Priority Data

Aug. 9, 1999 (JP) ............................... 11/225697
Apr. 3, 2000 (JP) ..................................... 2000/101564

(51) Int. Cl.⁷ ................................................. H05B 3/68
(52) U.S. Cl. .............................. 219/444.1; 219/448.1; 219/465.1; 219/466.1; 219/468; 219/390; 392/416; 118/724
(58) Field of Search .......................... 219/444.1, 448.1, 219/465.1, 466.1, 468, 385, 390, 405, 411; 392/416, 418; 118/724, 275

(56) References Cited

U.S. PATENT DOCUMENTS

| | | | |
|---|---|---|---|
| 4,786,799 A | 11/1988 | Welle, Jr. et al. | |
| 5,582,756 A | 12/1996 | Koyama | |
| 5,766,363 A | * 6/1998 | Mizuno et al. | ............. 118/725 |
| 6,465,763 B1 | 10/2002 | Ito et al. | |
| 6,475,606 B2 | 11/2002 | Niwa | |
| 6,507,006 B1 | 1/2003 | Hiramatsu et al. | |
| 6,677,557 B2 | 1/2004 | Ito et al. | |
| 2002/0043527 A1 | 4/2002 | Ito | |
| 2003/0015521 A1 | 1/2003 | Ito | |

FOREIGN PATENT DOCUMENTS

| | | |
|---|---|---|
| EP | 1 109 423 | 6/2001 |
| JP | 60-249282 | 12/1985 |
| JP | 3-114166 | 5/1991 |
| JP | 3-244928 | * 10/1991 |
| JP | 8-4000 | 1/1996 |
| JP | 11-8180 | 1/1999 |
| JP | 11-40330 | 2/1999 |

OTHER PUBLICATIONS

U.S. Appl. No. 10/049,293, filed Apr. 30, 2002, Ito et al.
U.S. Appl. No. 10/732,296, filed Dec. 11, 2003, Ito et al.
U.S. Appl. No. 10/746,081, filed Dec. 29, 2003, Hiramatsu et al.
U.S. Appl. No. 10/755,308, filed Jan. 13, 2004, Hiramatsu et al.
U.S. Appl. No. 10/766,027, filed Jan. 29, 2004, Ito et al.
U.S. Appl. No. 10/663,681, filed Sep. 17, 2003, Ito et al.

* cited by examiner

*Primary Examiner*—Shawntina Fuqua
(74) *Attorney, Agent, or Firm*—Oblon, Spivak, McClelland, Maier & Neustadt, P.C.

(57) ABSTRACT

An objective of the present invention is to provide a ceramic heater making it possible to heat an object to be heated, such as a silicon wafer, evenly. The ceramic heater of the present invention is a ceramic heater having and a resistance heating element formed on the surface of the ceramic substrate or inside the ceramic substrate, wherein: said ceramic heater is equipped with: a temperature-measuring means measuring the temperature of said ceramic substrate and an object to be heated; a control unit supplying electric power to said heating element; a memory unit memorizing the temperature data measured by said temperature-measuring means; and an operation unit calculating electric power required for said heating element from said temperature, said ceramic heater being constituted such that said heating element is divided into at least 2 or more circuits and different electric power is supplied to each of the circuits of said resistance heating element.

18 Claims, 10 Drawing Sheets

(a)

(b)

(a)

(b)

CERAMIC HEATER

TECHNICAL FIELD

The present invention relates to a ceramic heater used mainly in the semiconductor industry, for drying, sputtering and the like of the semiconductor and the like, and particularly to a ceramic heater wherein the temperature thereof can easily be controlled and the temperature evenness of its wafer-heating face is superior.

BACKGROUND ART

A semiconductor product is produced through the steps of forming a photosensitive resin as an etching resist on a silicon wafer and subjecting the silicon wafer to etching, and the like steps.

This photosensitive resin is liquid, and is applied onto a surface of the silicon wafer, using a spin coater and the like. After the application, the resin has to be dried. Thus, the silicon wafer subjected to the application process is put on a heater and heated.

Hitherto, as a heater made of metal and used for such a purpose, a heater wherein heating elements are arranged on the back surface of an aluminum plate is adopted.

SUMMARY OF THE INVENTION

However, such a heater made of metal has the following problems.

First, the thickness of the heater plate must be as thick as about 15 mm since the heater is made of metal. This is because a bend, a strain and so on are generated due to thermal expansion resulting from heating so that a silicon wafer put on the metal plate is damaged or inclined in case of a metal plate being thin. However, if the thickness of the heater plate is made thick, the heater becomes heavy and bulky.

Also, heating temperature is controlled by changing the voltage or amperage applied to the heating elements. However, since the metal plate is thick, the temperature of the heater plate does not follow the change in the voltage or amperage promptly. Thus, such a problem that the temperature cannot be easily controlled is caused.

Thus, as suggested in JP Kokai Publication Hei 8-8247, there is a technique suggested, wherein a nitride ceramic at which heating elements are formed is used to perform temperature-control while measuring the temperature near the heating elements.

However, when such a technique is used to heat a silicon wafer, a problem that the silicon wafer is damaged by thermal shock resulting from a temperature-difference on the surface of the heater is caused.

Thus, the inventors made eager investigations on causes of the damage of the silicon wafer. As a result, the inventors have found out that the occurrence of the damage of the silicon wafer, in spite of performing temperature-control, is owing to the following fact: even if single temperature control is conducted, it is difficult to make the temperature of the heating face even and the temperature difference arises depending on the portion of the silicone wafer, thus the silicon wafer is damaged.

The inventors have also found out a new fact that such unevenness of the temperature is significant in ceramics having a high thermal conductivity, such as nitride ceramic and carbide ceramic and the like.

Incidentally, JP Kokai Publication Hei 6-252055 proposes a controlling technique to control the temperature of the central portion higher than the temperature of the peripheral portion thereof, and JP Kokai Publication Sho 63-216283 proposes a controlling technique in which the circuits of the heating element is divided. However, each of them is the technique to control the temperature according to the predetermined schedule.

However, in the actual heating of the silicone wafer, a disturbance occurs in such a case that a silicone wafer with low temperature is put thereon Thus, with the above-mentioned technique wherein the schedule of controlling the temperature is determined in advance, the temperature control is hard to be done in the case that unexpected temperature change occurs.

Thus, repeating further investigations, the inventors have found out that by: dividing the above-mentioned resistance heating element to two or more circuits and performing the temperature control by supplying the different electric power based on the result of the temperature measurement to conduct heating so as to reduce the temperature difference on the face for heating an object to be heated (hereinafter, referred to as heating face as well) can be made even, the whole temperature of the object to be heated such as a semiconductor wafer and the like is made even, the damage of the semiconductor wafer is prevented, and the temperature control can be successfully done even in the case the unexpected temperature change occures, and have made the present invention which has, as the subject matter thereof, the following contents.

That is, a ceramic heater of the first aspect of the present invention is a ceramic heater comprising a ceramic substrate and a resistance heating element formed on the surface of the ceramic substrate or inside the ceramic substrate, wherein: the ceramic heater is equipped with:

a temperature-measuring means measuring the temperature of the ceramic substrate or an object to be heated;

a control unit supplying electric power to the heating element;

a memory unit memorizing the temperature data measured by the temperature-measuring means; and an operation unit calculating electric power required for the heating element from the temperature data, the ceramic heater being constituted such that the heating element is divided into at least 2 or more circuits and different electric power is supplied to each of the circuits.

A ceramic heater of the second aspect of the present invention is a ceramic heater comprising a ceramic substrate and a resistance heating element formed on the surface of the ceramic substrate or inside the ceramic substrate, wherein: the ceramic heater is equipped with:

a temperature-measuring means measuring the temperature of the ceramic substrate or an object to be heated;

a power source supplying electric power to the heating element;

a control unit controlling the power source;

a memory unit memorizing the temperature data measured by the temperature-measuring means; and an operation unit calculating electric power required for the heating element from the temperature data;

the ceramic heater being constituted such that the heating element is divided into at least 2 or more circuits and different electric power is supplied to each of the circuits.

In the first aspect and second aspect of the ceramic heater, the temperature-measuring means is, preferably, a thermoviewer.

| Explanation of symbols | |
|---|---|
| 10, 30, 50 | a ceramic heater |
| 11, 31, 51 | a heater plate |
| 12, 32 | a heating element |
| 13, 33 | a terminal pin |
| 14, 34 | a bottomed hole |
| 15, 35 | a through hole |
| 19 | a silicon wafer |
| 11a, 31a, 51a | a wafer-heating face |
| 11b, 31b, 51b | a bottom face |
| 16 | a lifter pin |
| 17, 37 | a thermocouple |
| 18 | a conductor-filled through hole |
| 21, 41, 61, 610 | a memory unit |
| 22, 42, 62, 620 | an operation unit |
| 23, 43, 63 | a control unit |
| 560 | a supporting pin |
| 600 | a thermoviewer |
| 630 | a power source unit |

DETAILED DISCLOSURE OF THE INVENTION

Firstly, the ceramic substrate of the first aspect of the present invention is explained.

The ceramic heater of the first aspect of the present invention is a ceramic heater comprising a ceramic substrate and a resistance heating element formed on the surface of the ceramic substrate or inside the ceramic substrate, wherein: the ceramic heater is equipped with:

a temperature-measuring means measuring the temperature of the ceramic substrate or an object to be heated;

a control unit supplying electric power to the heating element;

a memory unit memorizing the temperature data measured by the temperature-measuring means; and an operation unit calculating electric power required for the heating element from the temperature data, the ceramic heater being constituted such that the heating element is divided into at least 2 or more circuits and different electric power is supplied to each of the circuits.

According to the above-mentioned ceramic heater of the first aspect of the present invention, the temperature control can be performed by changing an electric power supplied to the heating element divided into 2 or more circuit based on the measurement result of the temperature of the wafer-heating face or the temperature of the object to be heated such as a semiconductor wafer and the like, thus the temperature of the wafer-heating face can be made even. Therefore, the whole temperature of the object to be heated can be made even and the damage on the silicone wafer can be prevented.

Figure 1:
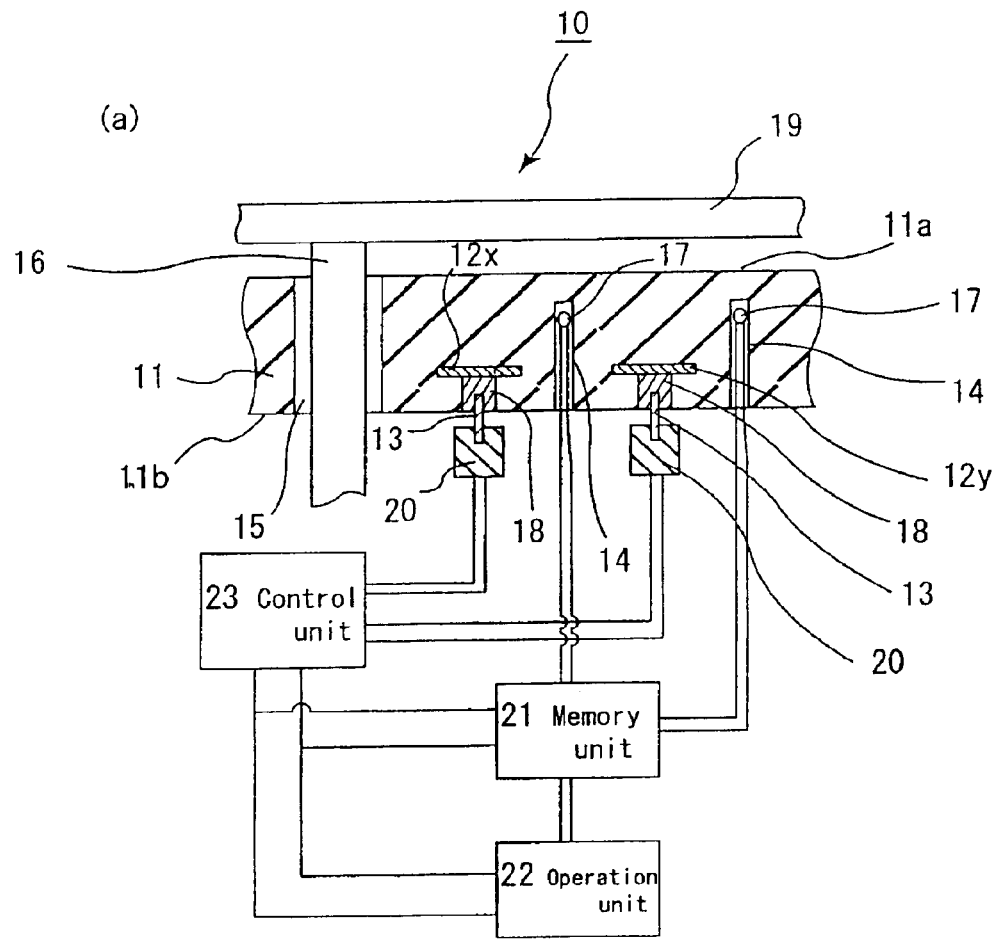
FIG. 1(a) is a block figure that schematically shows an example of a ceramic heater of the first aspect of the present invention.
FIG. 1(b) is a partially enlarged sectional view of this ceramic heater.
Figure 1:
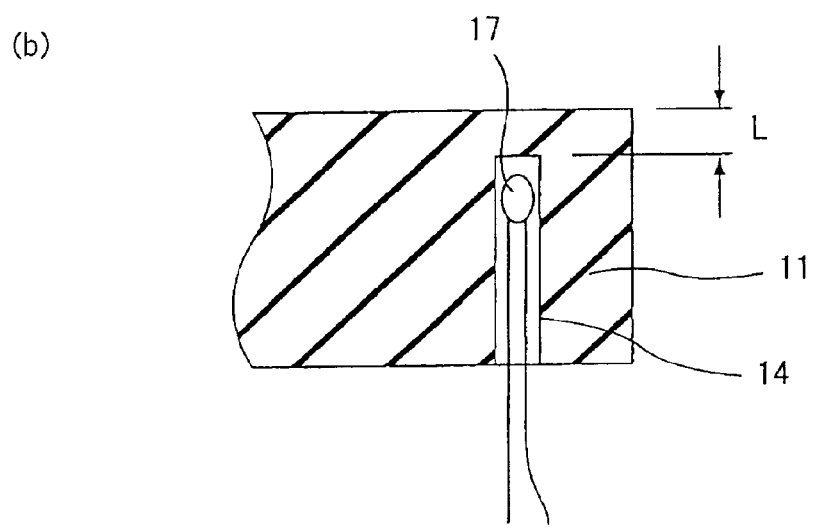
Figure 2:
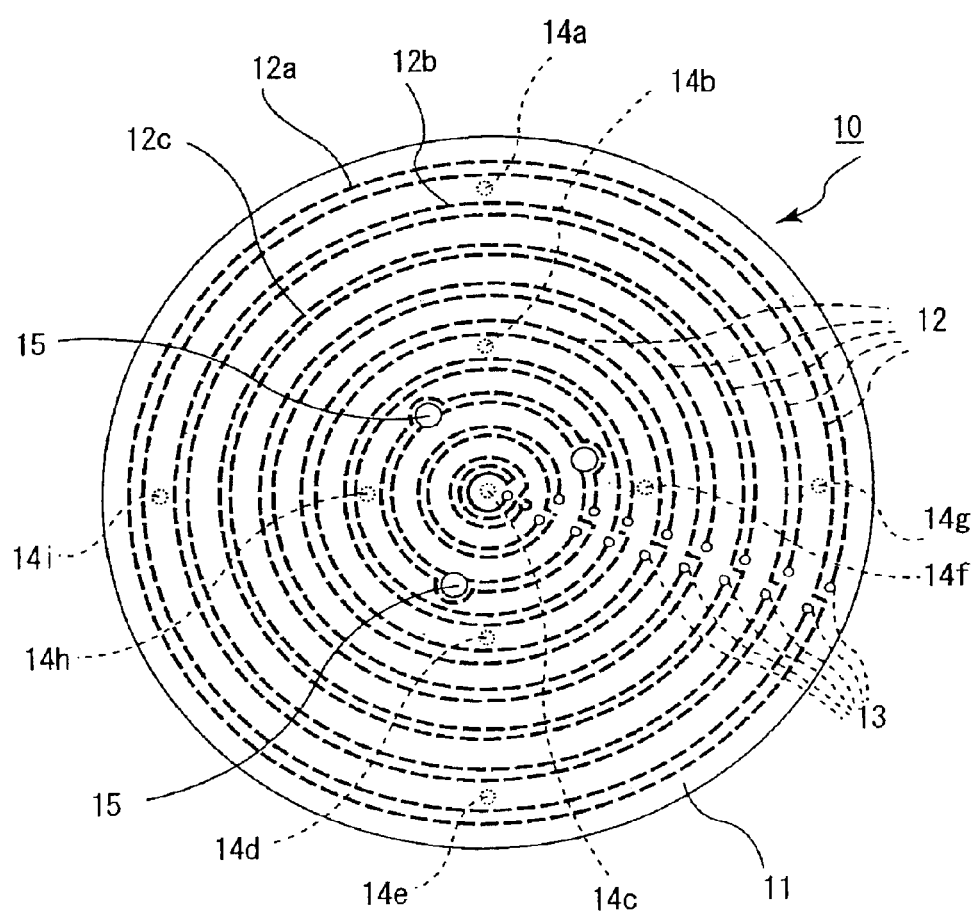
FIG. 2 is a plane view that schematically shows an example of a ceramic heater of the first aspect of the present invention.

FIG. 1(a) is a block figure that schematically shows an example of a ceramic heater of the first aspect of the present invention, and FIG. 1(b) is a partially enlarged sectional view of the ceramic heater. FIG. 2 is a plane view that schematically shows a heater portion which constitutes a ceramic heater shown in FIG. 1.

A heater plate 11 is formed into a disc form. Heating elements 12(12x, 12y) are formed into a pattern of concentric circles inside the heater plate 11 in order to heat a wafer-heating face 11a of the heater plate 11 in such a manner that the whole temperature of the wafer-heating face 11a thereof becomes even. As to these heating elements 12, two concentric circles near to each other, as one set, are connected into one line. Terminal pins 13, which will be input/output terminals, are connected to two ends thereof through a conductor-filled through hole 18. The terminal pins 13 are fitted with sockets 20, and the sockets 20 are connected to a control unit 23 having a power source.

Through holes 15 into which lifter pins 16 are inserted are formed in areas near the center. Further, bottomed holes 14a to 14i into which thermocouples 17 as a temperature-measuring means (a temperature-measuring element) are inserted are also formed.

As shown in FIG. 1, in this ceramic heater 10, lifter pins 16 are inserted into the through holes 15. A silicon wafer 19 is put on the lifter pins 16. By moving the lifter pins 16 upwards or downwards, the silicon wafer 19 can be delivered to a non-illustrated carrier machine, or the silicon wafer 19 can be received from the carrier machine.

Also, by the supporting pins 560 (reference to FIG. 6), the silicon wafer can be heated while being held at a given distance apart from the wafer-heating face. The distance thereof is preferably to be 50 to 5000 $\mu$m.

Bottomed holes 14 are made, from the side of the bottom face 11b, in the heater plate 11. Thermocouples 17 are fixed to the bottoms of the bottomed holes 14. The thermocouples 17 are connected to a memory unit 21 so that the temperatures of the respective thermocouples 17 are measured every given interval and then, the data can be memorized. This memory unit 21 is connected to a control unit 23 and an operation unit 22. On the basis of the data memorized in the memory unit 21, the operation unit 22 calculates a voltage value and so on which are used for the control. On the basis of this calculation, a certain voltage is applied from the control unit 23 to the respective heating elements 12 so that the temperature on a wafer-heating face 11a can be made even.

The following will describe the operation of the ceramic heater 10 of the present invention.

First, the control unit 23 is operated so that an electric power is supplied to the ceramic heater 10. As a result, the temperature of the heater plate 11 itself rises, but the surface temperature of the peripheral portion thereof becomes slightly low.

The data measured by the thermocouples 17 is once stored in the memory unit 21. Next, the temperature data is sent to the operation unit 22. In the operation unit 22, temperature-differences ΔT: among each measured point; or the temperature-difference from the given value are calculated and further data ΔW necessary for making the temperature on the wafer-heating face 11a even are calculated.

For example, in the case that the temperature-difference ΔT is generated between the heating element 12x and the heating element 12y, and if the temperature of the heating element 12x is lower, operations to obtain electric power data ΔW for making the ΔT to zero are run, this data is transmitted to the control unit 23 and an electric power based on this data is supplied to the heating element 12x to raise the temperature thereof. Regarding the algorithm for calculating the electric power, a method for calculating the electric power necessary for the rise in the temperature by utilizing the specific heat of the heater plate 11 and the weight of the heated area is most simple. A correction coefficient originating from the pattern of the heating elements may be considered together with these factors. Alternatively, a temperature-rising test is beforehand performed on a specific heating element pattern, and functions among a temperature-measuring position, a supplying electric power and temperature are beforehand obtained. From these functions, the supplying electric power may be calculated. The applying voltage and time corresponding to the electric power calculated in the operation unit 22 are transmitted to the control unit 23. On the basis of these values, electric powers are supplied to the respective heating elements 12 by the control unit 23.

That is, the ceramic heater of the first aspect of the present invention has the operation unit 22. Thus, even in case that an expected temperature change occurred, the electric power for making the temperature even can be calculated, and a practical temperature control can be achieved.

Next, respective parts which constitute the ceramic heater of the first aspect of the present invention are explained.

In the ceramic heater 10, the thickness of the heater plate 11 is preferably 0.5 to 5 mm. If the thickness is thinner than 0.5 mm, the strength thereof is lowered so that the heater plate is easily damaged. On the other hand, if the thickness is thicker than 5 mm, heat is not easily conducted so that heating efficiency is lowered.

The ceramic constituting the ceramic heater 10 is desirably a nitride ceramic or a carbide ceramic.

A nitride ceramic or a carbide ceramic has a smaller thermal expansion coefficient than metals and far higher mechanical strength than metals. Thus, even if the thickness of a ceramic plate 11 is made thin, the heater plate is not warped or distorted by heating. As a result, the heater plate can be made thin and light. Further, since the thermal conductivity of the heater plate 11 is high and the heater plate itself is thin, the surface temperature of the heater plate follows a change in the temperature of the heating element promptly. In other words, by changing voltage or amperage to change the temperature of the heating element 12, the surface temperature of the heater plate (the temperature of the wafer-heating face) can be controlled.

Examples of the nitride ceramic include aluminum nitride, silicon nitride, boron nitride and titanium nitride and the like. These may be used alone or in combination of two or more.

Examples of the carbide ceramic include silicon carbide, zirconium carbide, titanium carbide, tantalum carbide and tungsten carbide and the like. These may be used alone or in combination of two or more.

Among these, aluminum nitride is most preferred. The reasons for this are as follows: its thermal conductivity is highest, that is, 180 W/m·K and aluminum nitride has superior temperature-following property, on the other hand, since aluminum nitride easily causes unevenness of temperature distribution, it is necessary to adopt the temperature-measuring means as shown in the present invention.

In the ceramic heater 10 of the present invention it is desired that:, bottomed holes 14a to 14i (hereinafter, may be referred to simply as bottomed holes 14, as well) are made, from the opposite side (bottom face) of a wafer-heating face 11a for putting an object to be heated, toward the wafer-heating face 11a; the bottom of the bottomed holes 14 is formed relatively nearer to the wafer-heating face 11a than to the heating elements 12; and a temperature-measuring means is set up in this bottomed hole 14. (reference to FIG. 1)

The distance L between the bottom of the bottomed holes 14 and the wafer-heating face 11a is desirably from 0.1 mm to ½ of the thickness of the ceramic substrate. (reference to FIG 1(b))

Thus, a place for temperature-measurement is nearer to a wafer-heating face 11a than to the heating element 12. Therefore, the temperature of the silicone wafer can be more correctly measured. This correctly measured result of the temperature is memorized in the memory unit 21, and then an electric voltage which is going to be supplied to the heating element 12 in order to perform even heating is calculated in the operation unit 22 on the basis of the temperature data memorized in the memory unit 21. On the basis of the calculated result, a voltage for control is applied to the heating element 12 by the control unit 23, thus the temperature of the wafer-heating face becomes even. Therefore, the whole of the object to be heated such as a silicon wafer and the like can be evenly heated.

If the distance between the bottom of the bottomed holes 14 and the wafer-heating face 11a is below 0.1 mm, heat is radiated so that a temperature distribution is produced on the wafer-heating face 11a. On the other hand, if the distance is over ½ of the thickness thereof, the influence of the temperature of the heating elements over the control apt to be significant so that a temperature distribution is produced on the wafer-heating face 11a as well.

The diameter of the bottomed holes 14 is desirably 0.3 to 0.5 mm. If the diameter is too large, the heat radiant property becomes too large. If the diameter is too small, the processability becomes poor so that the distance between the wafer-heating face 11a and the bottomed holes cannot be made even.

As shown in FIG. 2, the bottomed holes 14a to 14i are desirably arranged into a cross form, and symmetrically with respect to the center of the heater plate 11. Such arrangement makes it possible to measure the whole temperature of the wafer-heating face.

Examples of the temperature-measuring means include a thermocouple and a platinum temperature-measuring resistance, a thermistor and the like. Besides, the temperature-measuring means using an optical means such as a thermoviewer and the like can be listed.

In case that the above-mentioned thermoviewer is used, the precision of the temperature control of the object to be heated improves since the temperature on the surface of the ceramic substrate can be measured as well as the surface temperature of the object to be heated such as a semiconductor wafer and the like can be directly measured.

The temperature control using the above-mentioned thermoviewer is to be explained in detail in the explanation of the ceramic heater of the second aspect of the present invention.

Examples of the thermocouple include K, R, B, S, E, J and T type thermocouples and the like, as described in JIS-C-1602 (1980). Among these, the K type thermocouple is preferred.

Desirably, the size of the connecting portion of the thermocouple is equal to or more than the diameter of its strand wire, and is 0.5 mm or less. If the connecting portion is large, the thermal capacity is large so that the response becomes poor. Incidentally, making the size thereof smaller than the diameter of the strand wire is difficult.

In case that the temperature measuring element is used, the temperature-measuring element may be bonded to the bottoms of the bottomed holes 14, using gold solder, silver solder and the like. The temperature-measuring elements may be inserted into the bottomed holes 14 and then, may be sealed with a heat resistant resin. The both manners may be used together.

Examples of the heat resistant resin may be thermosetting resins, in particular, epoxy, polyimide, bismaleimide-triazine and the like. These resins may be used alone or in combination of two or more.

The gold solder is desirably at least one selected from an alloy of 37 to 80.5% by weight of Au-63 to 19.5% by weight of Cu, an alloy of 81.5 to 82.5% by weight of Au-18.5 to 17.5% by weight of Ni. These have a melting temperature of 900° C. or higher and are not easily melted even at a high temperature range.

The silver solder that can be used may be, for example, a Ag—Cu type.

As shown in FIG. 2, the heating elements 12 are desirably divided into at least two or more circuits, and more desirably divided into 2 to 10 circuits. By the division into the circuits, each electric power supplied to the respective circuits can be controlled to change the calorific value thereof so that the temperature of the wafer-heating face 11a can be adjusted.

Examples of the pattern of the heating elements 12 include the concentric circuits shown in FIG. 2, a spiral, eccentrics, and winding lines and the like.

In the present invention, the heating elements may be formed on the surface (bottom face) of the heater plate and may be formed inside the heater plate.

In case of forming a heating element on the surface of the heater plate 11, adopting the following method is preferred: a method in which a conductor containing paste containing metal particles is applied to the surface of the heater plate 11 to form a conductor containing paste layer having a given pattern, and then this is fired to sinter the metal particles on the surface of the heater plate 11. Incidentally, the sintering of the metal is sufficient if the metal particles are melted and adhered to each other; and the metal particles and the ceramic are melted and adhered to each other.

When the heating elements are formed on the surface of the heater plate 11, the thickness of the heating elements is preferably 1 to 30 μm and more preferably 1 to 10 μm. When the heating elements are formed inside the heater plate 11, the thickness thereof is preferably 1 to 50 μm.

When the heating elements are formed on the surface of the heater plate 11, the width of the heating elements is preferably 0.1 to 20 mm and more preferably 0.1 to 5 mm. When the heating elements are formed inside the heater plate 11, the width of the heating elements is preferably 5 to 20 μm.

The resistance value of the heating elements can be changed dependently on their width or thickness. The above-mentioned ranges are however most practical. The resistance value becomes larger as the heating elements become thinner and narrower. The thickness and the width of the heating elements become larger in the case that the heating elements are formed inside the heater plate 11. The reason for this is as follows:

when the heating elements are formed inside, the distance between the wafer-heating face and the heating elements becomes short so that the evenness of the temperature on the surface becomes poor, thus, it is necessary to make the width of the heating elements themselves large;

also, when the heating elements are formed inside, it is unnecessary to consider the adhesiveness to any ceramic, for example, a nitride ceramic. Therefore, it is possible to use a high melting point metal such as tungsten or molybdenum, or a carbide of tungsten, molybdenum and the like. Thus, it becomes possible to make the resistance value thereof high. Therefore, the thickness itself may be made large in order to prevent disconnection and so on. For these reasons, the heating elements desirably have the above-mentioned thickness and width.

By setting the position where the heating element is formed in this way, heat generated from the heating element diffuses all over the heater plate while the heat is conducted. As a result, the temperature distribution on the surface for heating an object to be heated (a silicon wafer) is made even so that the temperatures at respective portions of the object to be heated are made even.

The heating elements may have a rectangular section or an elliptical section. But, they desirably have a flat section. This is because: in case of the flat section, heat is more easily radiated toward the wafer-heating face. Thus, a temperature distribution on the wafer-heating face is not easily generated.

The aspect ratio (the width of the heating element/the thickness of the heating element) of the section is desirably 10 to 5000.

Adjustment thereof into this range makes it possible to increase the resistance value of the heating elements and keep the evenness of the temperature on the wafer-heating face.

In the case that the thickness of the heating elements is made constant: if the aspect ratio is smaller than the above-mentioned range, the amount of heat conduction toward the wafer-heating face of the heater plate 11 becomes small so that a thermal distribution similar to the pattern of the heating elements is generated on the wafer-heating face; on the other hand, if the aspect ratio is too large, the temperature of the portions just above the centers of the heating elements becomes high so that a thermal distribution similar to the pattern of the heating elements is also generated on the wafer-heating face. Accordingly, if temperature distribution is considered, the aspect ratio of the section is preferably 10 to 5000.

When the heating elements are formed on the surface of the heater plate 11, the aspect ratio is desirably 10 to 200.

When the heating elements are formed inside the heater plate 11, the aspect ratio is desirably 200 to 5000.

The aspect ratio is set larger in the case that the heating elements are formed inside the heater plate 11. This is based on the following reason. If the heating elements are formed inside, the distance between the wafer-heating face and the heating elements becomes short so that temperature evenness on the surface becomes poor. It is therefore necessary to make the heating elements themselves flat.

The position where the heating elements of the present invention are formed to be biased inside the heater plate 11 is desirably at a position near the bottom face 11b which is on the opposite side to the wafer-heating face 11a of the heater plate 11, and at a position exceeds 50% and up to 99% of the distance from a wafer-heating face 11a to the bottom face 11b.

If the value is 50% or less, the position is too near to the wafer-heating face so that temperature-dispersion is caused. Conversely, if the value is over 99%, the heater plate 11 itself warps to damage a silicon wafer.

In the case that the heating elements are arranged inside the heater plate 11, plural heating element formed layers may be formed. In this case, the patterns of the respective layers are preferably disposed in mutually complementary relation so that, when viewed from the position above the wafer-heating face, the patterns are formed in all areas. A preferred example of such a structure having a staggered arrangement.

The conductor containing paste is not particularly limited, and is preferably a paste comprising not only metal particles or a conductive ceramic for keeping electrical conductivity but also a resin, a solvent, a thickener and so on.

The metal particles are preferably of, for example, a noble metal (gold, silver, platinum or palladium), lead, tungsten, molybdenum, nickel and the like. These may be used alone or in combination of two or more. These metals are not relatively easily oxidized, and have a resistance value sufficient for generating heat.

Examples of the conductive ceramic include carbides of tungsten, molybdenum and the like. These may be used alone or in combination of two or more.

The particle diameter of these metal particles or the conductive ceramic is preferably 0.1 to 100 $\mu$m. If the particle diameter is too fine, that is, below 0.1 $\mu$m, they are easily oxidized. On the other hand, if the particle diameter is over 100 $\mu$m, they are not easily sintered so that the resistance value becomes large.

The shape of the metal particles may be spherical or scaly. When these metal particles are used, they may be a mixture of spherical particles and scaly particles.

In the case that the metal particles are scaly or a mixture of spherical particles and scaly particles, metal oxides between the metal particles are easily retained and adhesiveness between the heating elements and the nitride ceramic and the like are made sure. Moreover, the resistance value can be made large. Thus, this case is profitable.

Examples of the resin used in the conductor containing paste include epoxy resins, phenol resins and the like. Examples of the solvent are isopropyl alcohol and the like. Examples of the thickener are cellulose and the like.

It is desired to add a metal oxide to the metal particles in the conductor containing paste and make the heating element into a sintered body of the metal particles and the metal oxide, as described above. By sintering the metal oxide together with the metal particles in this way, the nitride ceramic or the carbide ceramic, which is the heater plate, can be closely adhered to the metal particles.

The reason why the adhesiveness to the nitride ceramic or the carbide ceramic is improved by mixing the metal oxide is unclear, but would be based on the following. The surface of the metal particles, or the surface of the nitride ceramic or the carbide ceramic is slightly oxidized so that an oxidized film is formed thereon. Pieces of these oxidized films are sintered and integrated with each other through the metal oxide so that the metal particles and the nitride ceramic or the carbide ceramic are closely adhered to each other.

A preferred example of the metal oxide is at least one selected from the group consisting of lead oxide, zinc oxide, silica, boron oxide ($B_2O_3$), alumina, yttria, and titania.

These oxides make it possible to improve adhesiveness between the metal particles and the nitride ceramic or the carbide ceramic without increasing the resistance value of the heating elements.

When the total amount of the above mentioned metal oxides is set to 100 parts by weight, the weight ratio of the above mentioned lead oxide, zinc oxide, silica, boron oxide ($B_2O_3$), alumina, yttria and titania is as follows: lead oxide: 1 to 10, silica: 1 to 30, boron oxide: 5 to 50, zinc oxide: 20 to 70, alumina: 1 to 10, yttria: 1 to 50 and titania: 1 to 50. The weight ratio is preferably adjusted within the scope that the total thereof is not over 100 parts by weight.

By adjusting the amounts of these oxides within these ranges, the adhesiveness to the nitride ceramic can be particularly improved.

The addition amount of the metal oxides to the metal particles is preferably 0.1% by weight or more and less than 10% by weight. The area resistivity when the conductor containing paste having such a structure is used to form the heating elements is preferably from 1 m$\Omega$/□ to 45 $\Omega$/□. If the area resistivity is over 45 m$\Omega$/□, the calorific value for an applied voltage becomes too small so that, in the ceramic plate 11 wherein heating elements are set on its surface, its calorific value is not easily controlled. If the addition amount of the metal oxides is 10% by weight or more, the area resistivity exceeds 50 m$\Omega$/□. As a result, the calorific value becomes too large so that temperature-control becomes difficult and the evenness of the temperature distribution deteriorates.

In case that the heating elements are formed on the surface of the heater plate 11, a metal covering layer 38 (reference to FIG. 3) is preferably formed on the surface of the heating elements. The metal covering layer prevents a change in the resistance value based on oxidization of the inner metal sintered body. The thickness of the formed metal covering layer is preferably from 0.1 to 10 $\mu$m.

The metal used when the metal covering layer is formed is not particularly limited if the metal is a metal which is non-oxidizable. Specific examples thereof include gold, silver, palladium, platinum, nickel and the like. These may be used alone or in combination of two or more. Among these metals, nickel is preferred.

In the heating element, a terminal for connecting to a power source is necessary. This terminal is fixed to the heating element through solder. Nickel prevents solder from being thermally diffused An example of the connecting terminal is a terminal pin 13 made of Kovar.

In the case that the heating elements are formed inside the heater plate 11, no coating is necessary since the surface of the heating elements is not oxidized. In the case that the heating elements are formed inside the heater plate 11, a part of the heating elements may be exposed in the surface. It is allowable that conductor filled through holes for connecting to the heating elements are made in portions for the terminals, and terminals are connected and fixed to the conductor filled through holes.

In the case that the connecting terminals are connected, an alloy such as silver-lead, lead-tin or bismuth-tin can be used as a solder. The thickness of the solder layer is desirably from 0.1 to 50 μm. This is because this range is a range sufficient for maintaining connection based on the solder.

Next, the process for producing a ceramic heater of the first aspect of the present invention is explained. The following will describe the process for producing a ceramic heater 10 wherein the heating elements are formed inside the heater plate (reference to FIG. 1 to 2).

(1) Step of Manufacturing the Heater Plate

First, powder of a nitride ceramic or a carbide ceramic is mixed with a binder, a solvent and so on to prepare a paste. This is used to form a green sheet.

As the above-mentioned ceramic powder, aluminum nitride, silicon carbide and the like can be used. If necessary, a sintering aid such as yttria may be added.

As the binder, desirable is at least one selected from an acrylic binder, ethylcellulose, butylcellosolve, and polyvinyl alcohol.

As the solvent, desirable is at least one selected from α-terpineol and glycol.

A paste obtained by mixing these is formed into a sheet form by the doctor blade process, to form a green sheet.

The thickness of the green sheet is preferably 0.1 to 5 mm.

Next, the following are made in the resultant green sheet if necessary: portions which will be through holes into which lifter pins for supporting a silicon wafer are inserted; portions which will be bottomed holes in which temperature-measuring elements such as thermocouples are buried; portions which will be conductor filled through holes for connecting the heating elements to external terminal pins; and so on. After a green sheet lamination that will be described later is formed, the above-mentioned processing may be performed.

(2) Step of Printing a Conductor Containing Paste on the Green Sheet

A metal paste or a conductor containing paste containing an electrically conductive ceramic is printed on the green sheet.

This conductor containing paste contains metal particles or conductive ceramic particles.

The average particle diameter of tungsten particles or molybdenum particles is preferably 0.1 to 5 μm. If the average particle is below 0.1 μm or over 5 μm, the conductor containing paste is not easily printed.

Such a conductor containing paste may be a composition (paste) obtained by mixing, for example, 85 to 87 parts by weight of the metal particles or the electrically conductive ceramic particles; 1.5 to 10 parts by weight of at least one kind of binder selected from acrylic binders, ethylcellulose, butylcellosolve and polyvinyl alcohol; and 1.5 to 10 parts by weight of at least one solvent selected from α-terpineol and glycol.

(3) Step of Laminating the Green Sheets

Green sheets on which no conductor containing paste is printed are laminated on the upper and lower sides of the green sheet on which the conductor containing paste is printed.

At this time, the number of the green sheet laminated on the upper side is made larger than that of the green sheet laminated on the lower side to cause the position where the heating elements are formed to be biased toward the bottom face.

Specifically, the number of the green sheets laminated on the upper side is preferably 20 to 50, and that of the green sheets laminated on the lower side is preferably 5 to 20.

(4) Step of Firing the Green Sheet Lamination

The green sheet lamination is heated and pressed to sinter the ceramic particles and the inner conductor containing paste in the green sheets.

The heating temperature is preferably 1000 to 2000° C., and the pressing pressure is preferably 10 to 20 MPa. The heating is performed in the atmosphere of an inert gas. As the inert gas, argon, nitrogen and the like can be used.

After the firing, bottomed holes 14 into which temperature-measuring elements will be inserted may be made. The bottomed holes 14 can be made by blast treatment such as sandblast after surface-polishing. Terminal pins 13 are connected to the conductor filled through holes for connecting to the inner heating elements, and then the portion is heated for reflowing. The heating temperature is suitably 200 to 500° C.

Furthermore, thermocouples and the like as temperature-measuring elements are inserted and set up with silver solder, gold solder and the like, and then the holes are sealed with a heat-resistant resin such as polyimide and the like to finish the manufacture of the ceramic heater.

Figure 3:
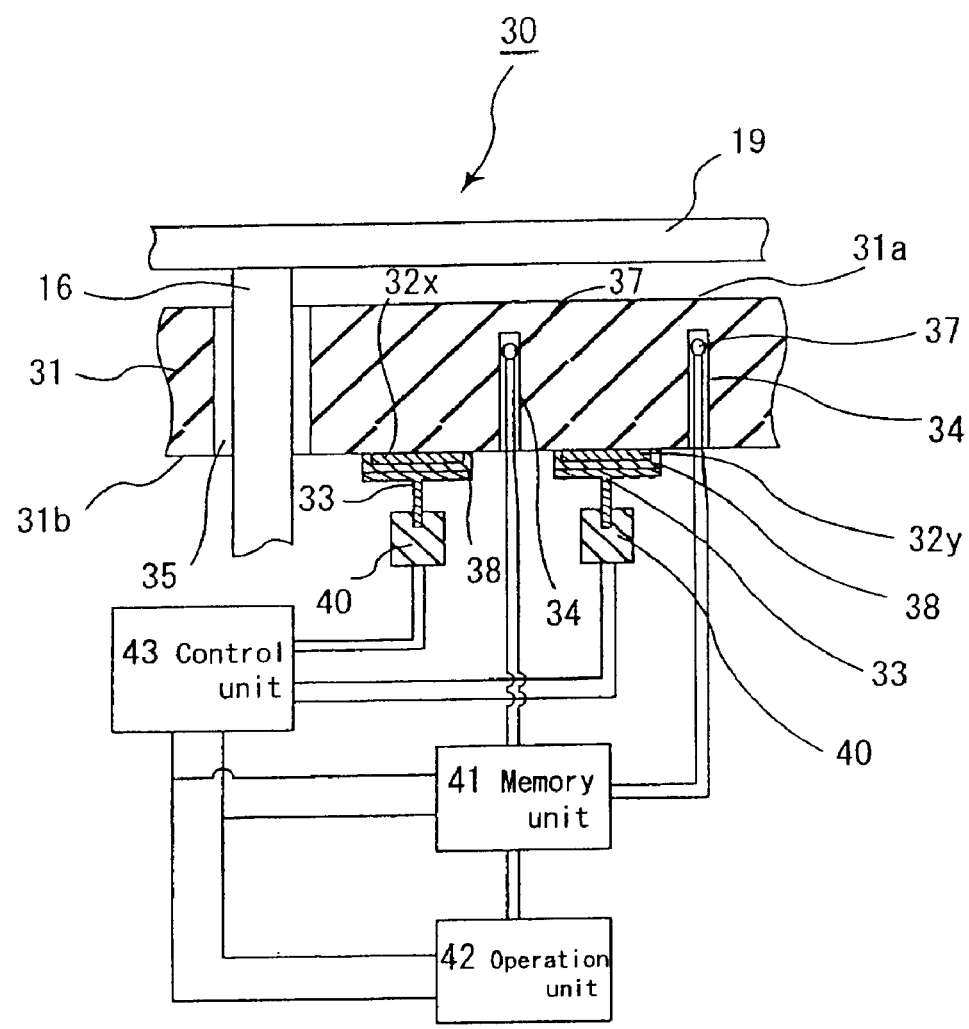
FIG. 3 is a block figure that schematically shows another example of a ceramic heater of the first aspect of the present invention.

FIG. 3 is a block figure that schematically shows another example of a ceramic heater of the present invention.

In a ceramic heater 30 shown in FIG. 3, heating elements 32 (32x, 32y) are formed on a bottom face 31b of a heater plate 31, and metal covering layers 38 are formed around the heating elements 32.

A terminal pin 33 is connected and fixed to the heating elements through the metal covering layer 38. The terminal pin 33 is fitted with a socket 40. This socket 40 is connected to a control unit 43 having a power source. Other parts are formed in the same way as in the ceramic heater shown in FIG. 2.

That is, the shape of the heater plate 31 is similar to the heater plate 11 shown in FIG. 1 which is in a disc shape. Also, planar view of the pattern of the heating element 32 formed on the heater plate 11, the position at which the heating elements are formed and the shape and formed position of the bottomed holes 34 are similar to the ceramic heater 10 shown in FIG. 2.

Next, the operation of the ceramic heater 30 shown in FIG. 3 is explained.

The ceramic heater 30 shown in FIG. 3 operates in the same way as the ceramic heater 10 shown in FIG. 1 to 2. The temperatures of thermocouples 32x, 32y are measured every given interval. Thus, the data is memorized in the memory unit 41. From the data, a voltage value and so on for control are calculated in the operation unit 42. On the basis of these, a certain amount of voltage is applied from the control unit 43 to the heating elements 32x, 32y so that the whole temperature of the wafer-heating face 31a of the ceramic heater 30 can be made even.

Next, the process for producing a ceramic heater 30 shown in FIG. 3 is explained.

(1) Step of Forming the Heater Plate

If necessary, a sintering aid such as yttria, a binder and so on are blended with powder of the above-mentioned nitride ceramic, such as aluminumnitride, or a carbide ceramic to prepare a slurry. Thereafter, this slurry is made into a granular form by spray drying and the like. The granule is put into a mold and pressed to be formed into a plate form and the like form. Thus, a raw formed body(green) is formed.

Next, portions that will be the through holes 35 into which lifer pins for supporting a silicon wafer are inserted; and portions that will be the bottomed holes 34 in which temperature-measuring elements such as thermocouples are buried, are formed in the raw formed body by drilling, blast treatment and the like if necessary.

Next, this raw formed body is heated and fired to be sintered. Thus, a plate made of the ceramic is produced. Thereafter, the plate is made into a given shape to produce the heater plate 31. The shape of the raw formed body may be such a shape that the sintered body can be used as it is. By heating and firing the raw formed body under pressure, the heater plate 31 having no pores can be produced. It is sufficient that the heating and the firing are performed at sintering temperature or higher. The firing temperature is 1000 to 2500° C. for nitride ceramics or carbide ceramics.

Incidentally, the through holes 35 and the bottomed holes 34 may be formed after manufacturing a heater plate 31. In this case, formation is desirably conducted by the sand blasting method using SiC particles and the like.

(2) Step of Printing a Conductor Containing Paste on the Heater Plate

A conductor containing paste is generally a fluid comprising metal particles, a resin and a solvent, and has a high viscosity. This conductor containing paste is printed in portions where heating elements are to be arranged, by screen printing and the like, to form a conductor containing paste layer. Since it is necessary that the heating elements make the whole temperature of the heater plate even, the conductor containing paste is desirably printed into a pattern of concentric circles, as shown in FIG. 2.

The conductor containing paste layer is desirably formed in the manner that a section of the heating elements 32 after the firing is rectangular and flat shape.

(3) Firing of the Conductor Containing Paste

The conductor containing paste layer printed on the bottom face of the heater plate 31 is heated and fired to remove the resin and the solvent and sinter the metal particles. Thus, the metal particles are sintered and baked onto the bottom face of the heater plate 31 to form the heating elements 32. The heating and firing temperature is preferably 500 to 1000° C.

If the above-mentioned metal oxides are added to the conductor containing paste, the metal particles, the heater plate and the metal oxides are sintered to be integrated with each other. Thus, the adhesiveness between the heating elements 32 and the heater plate 31 is improved.

(4) Forming a Metal Covering Layer

A metal covering layer is desirably deposited on the surface of the heating elements 32. The metal covering layer can be formed by electroplating, electroless plating, sputtering and the like. From the viewpoint of mass-productivity, electroless plating is optimal.

(5) Fitting of Terminals and so on

Terminals (terminal pins 33) for connecting to a power source are fitted up to ends of the pattern of the heating elements 32 with solder. Thermocouples are fixed to the bottomed holes 34 with silver solder, gold solder and the like. The bottomed holes are sealed with a heat resistant resin such as a polyimide and the like to finish the manufacture of the ceramic heater 30.

Incidentally, as to the ceramic heater of the present invention, electrostatic electrodes may be arranged to make an electrostatic chuck, or a chuck top conductor layer may be arranged thereon to make a wafer prober.

Next, the ceramic heater of the second aspect of the present invention will be described.

The second aspect of the present invention is a ceramic heater comprising a ceramic substrate and a resistance heating element formed on the surface of the ceramic substrate or inside the ceramic substrate, wherein: the ceramic heater is equipped with:
a temperature-measuring means measuring the temperature of the ceramic substrate or an object to be heated;
a power source supplying electric power to the heating element;
a control unit controlling the power source;
a memory unit memorizing the temperature data measured by the temperature-measuring means; and
an operation unit calculating electric power required for the heating element from the temperature data;
the ceramic heater being constituted such that the heating element is divided into at least 2 or more circuits and different electric power is supplied to each of the circuits.

According to the ceramic heater of the second aspect of the present invention, similarly to the ceramic heater of the first aspect of the present invention, the temperature control can be performed by changing an electric power supplied to the heating element divided into 2 or more circuit based on the measurement result of the temperature of the wafer-heating face or the temperature of the object to be heated, thus the whole temperature of the wafer-heating face can be made even. Therefore, the temperature of the object to be heated can be made even and the damage on the silicone wafer can be prevented.

Figure 6:
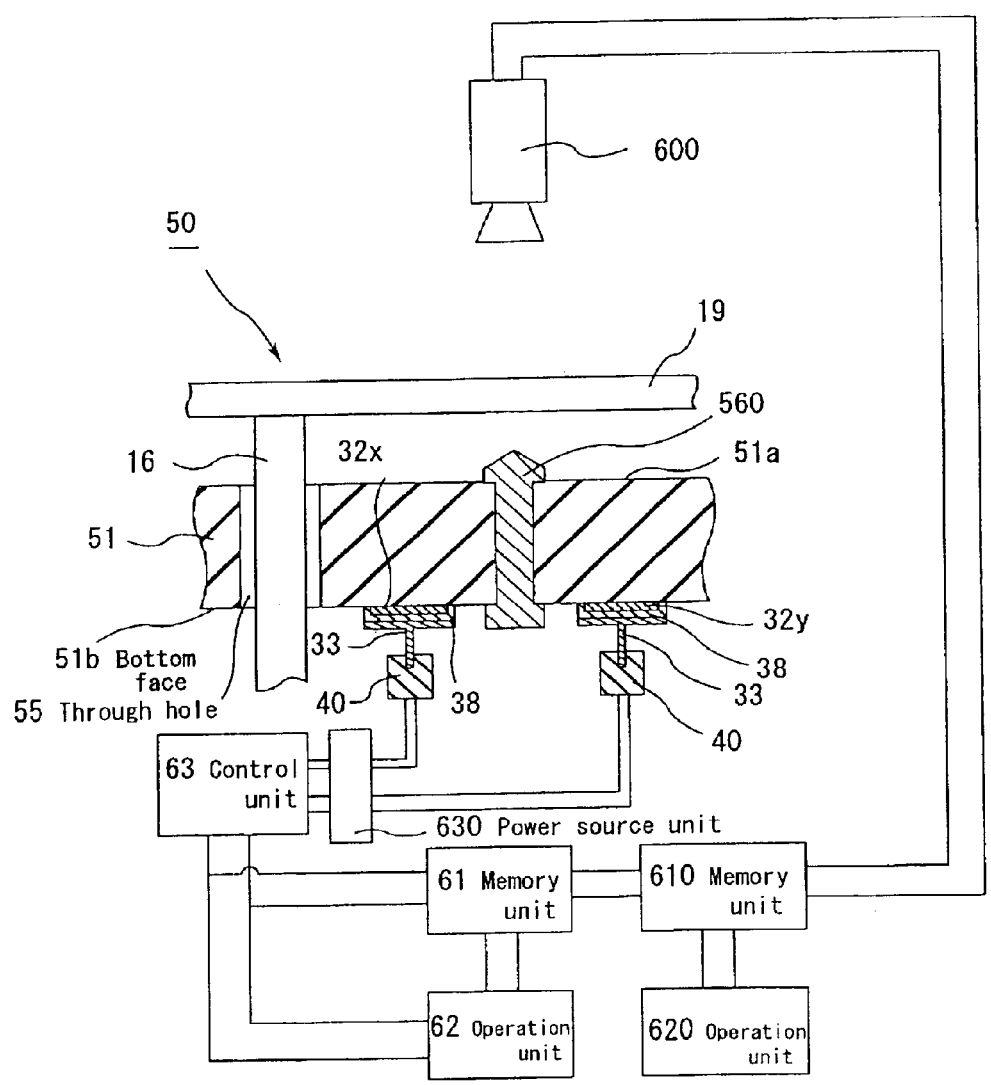
FIG. 6 is a block figure that schematically shows an example of a ceramic heater of the second aspect of the present invention.

FIG. 6 is a block figure that schematically shows an example of a ceramic heater of the second aspect of the present invention.

In the ceramic heater 50 shown in FIG. 6, except that supporting pins which supports a silicon wafer 19 in condition is that the silicone wafer is held at a given distance apart from the wafer-heating face 51*a* are formed, the peripheral portion of the heating plate 51 is constituted similarly to the ceramic heater 30 shown in FIG. 3.

In the ceramic heater 50, a thermoviewer 600 for measureing the surface temperature of a silicone wafer 19 or an object to be heated is equipped above the silicone wafer 19. The thermoviewer 600 is also connected to a memory unit 610. This memory unit 610 is connected to an operation unit 620 as well as being connected to a memory unit 61. Furthermore, the control unit 63 and the power source unit 630 are not integrated but separately equipped. The memory unit 61 is connected to the operation unit 62 and the control unit 63, similarly to the ceramic heater 30 shown in FIG. 3.

The memory unit 610 play a role of memorizing an image data obtained from the thermoviewer 600, as well as provisionally memorizing a temperature data obtained by performing image-processing based on the image data at the operation unit 620.

A memory unit 61 receives a temperature- measurement data as well as memorizing the data for performing other controls. The operation unit 62 performs an operation for control based on the temperature-measurement data and the like.

That is, in the ceramic heater shown in FIG. 6. The memory unit is divided into: a memory unit 610 for memorizing exclusively the image data obtained from the thermoviewer 600; and the memory unit 61 for memorizing the data for control such as the temperature-measurement data and the like. The operation unit is also divided into: an operation unit 620 for performing exclusively an operation of the image data obtained from the thermoviewer 600; and an operation unit 62 for controlling the heater. However, the memory unit 610 and the memory unit 61 may be integrated into one memory unit, and also, the operation unit 620 and the operation unit 62 may be integrated into one operation unit. Further, the control unit 63 and the power source unit 630 may be integrated.

The following will describe the action of the abovementioned ceramic heater 50 shown in FIG. 6.

Figure 7:
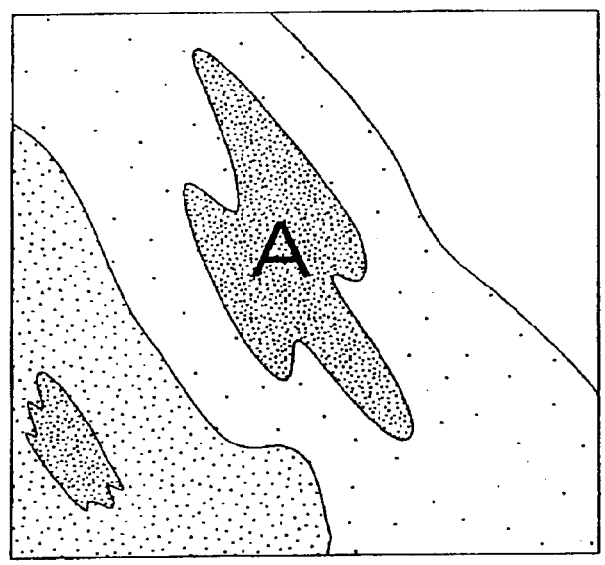
FIG. 7(a) is a schematic diagram that shows an image of data obtained by the thermoviewer shown in FIG. 6; and (b) is a schematic diagram which shows the state that the diagram shown in (a) is divided into plural pixels, and the colors of respective pixels are subjected to the multi-level judgment and valued in multiple steps.
Figure 7:
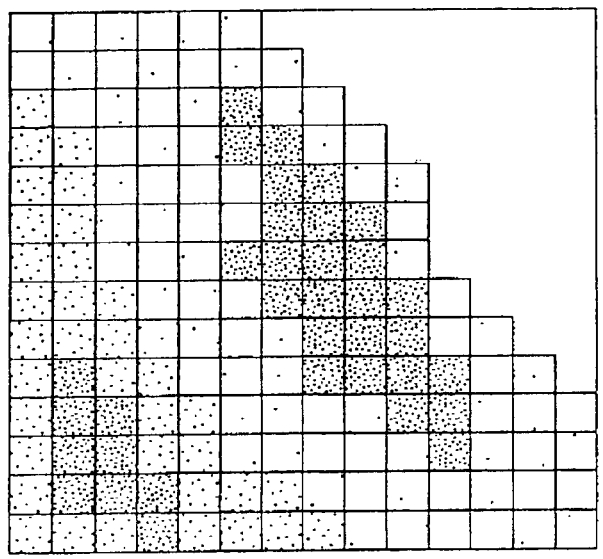

In the ceramic heater 50, a thermoviewer 600 is equipped as a temperature measuring means and shoots the surface of the silicone wafer 19 or the heater plate 51, and then transmits the optical data as well as the image to the memory unit 610. The data stored in the memory unit 610 is sent to the operation unit 620, and then subjected to the image processing. In the image processing, the image optically classified in color as shown in FIG. 7(a) is sectioned into plural pixels and then the colors of respective pixels are subjected to the multi-level judgment and valued in multiple steps as shown in FIG. 7(b).

In the ceramic heater 50, the control is conducted in condition that the circuit of the heating elements is divided into 2 or more. Thus, a plurality of temperature controlled areas exist. The temperature T of each temperature controlled area is obtained either: by regarding the value obtained from the multi-level judgment at a particular point A as the representative value; or by averaging each value obtained from the multi-level judgment at the respective temperature controlled areas. Then, the temperatures of the each temperature controlled area is stored in the memory unit 610 again.

The temperature data T stored in the memory unit 610 is transmitted to the memory unit 61 for the control. Then, for instance, the difference between the temperature T of temperature controlled area and the desired temperature t; or temperature-differences ΔT among respective temperature controlled areas are calculated and further data ΔW necessary for making ΔT into 0 are calculated, and then transmitted to the control unit 63. On the basis of these values, electric powers are supplied to the respective heating elements so that the temperature rises so as to make the temperature of the wafer-heating face or an object to be heated even.

It is apparent that, in the second aspect of the present invention, a thermocouples and the like may be used as the temperature measurement means.

Similarly to the ceramic heater as shown in FIG. 3, the ceramic heater 50 shown in FIG. 6 is assembled in the following manner that: after manufacturing the ceramic plate 31, the supporting pins 560 are equipped by processing the heater plate 31; the thermoviewer and the like as shown in FIG. 6 are equipped thereto; and then, wirings to a memory unit 61, 610, the operation unit 62, 620 and the like are furnished.

In the ceramic heater 50 as shown in FIG. 6, a thermoviewer is used as the temperature measurement means. Thus, the temperature control of the wafer-heating face of the heater plate and the object to be heated can be conducted by the area-temperature control. In this way, the precision of the temperature control is improved compared to the case of conducting a point-temperature control using a temperature-measuring element. Also, even in case that unexpected temperature change occurs, the temperature thereof can be recovered to the original temperature by immediately coping with it. Thus, practical temperature control can be realized.

As mentioned above, the ceramic heater of the present invention has been explained. Incidentally, the ceramic substrate may be made to an electrostatic chuck by arranging a resistance heating element on the surface thereof or inside thereof, as well as arranging an electrostatic chuck inside thereof.

Also, the ceramic substrate may be made to a wafer prober by arranging a resistance heating element on the surface thereof or inside thereof as well as arranging a chuck top conductor layer on the surface thereof, and further arranging a guard electrode and a ground electrode inside thereof.

BEST MODE FOR CARRYING OUT THE INVENTION

The present invention will be described in more detailed hereinafter.

(Example 1)

Manufacture of a Ceramic Heater made of Aluminum Nitride (reference to FIG. 3)

(1) A composition made of 100 parts by weight of aluminum nitride powder (average particle diameter: 1.1 $\mu$m), 4 parts by weight of yttria (average particle diameter: 0.4 $\mu$m), 12 parts by weight of an acrylic binder and an alcohol was subjected to spray-drying to make granular powder.

(2) Next, this granular powder was put into a mold and formed into a flat plate form to obtain a raw formed body (green).

(3) The raw formed body subjected to the above-mentioned working treatment was hot-pressed at 1800° C. and a pressure of 20 MPa to obtain a nitride aluminum plate having a thickness of 3 mm.

Next, this plate was cut out into a disk having a diameter of 210 mm to obtain a plate (heater plate) 31 made of the ceramic.

This raw formed body was drilled to form: portions for through holes 35, into which lifter pins for the silicon wafer are inserted; and portions (diameter: 1.1 mm, and depth: 2 mm) for bottomed holes 34, in which thermocouples are buried.

(4) A conductor containing paste was printed on the heater plate 31 obtained in the step (3) by screen printing. The pattern of the printing was made to a pattern of concentric circles as shown in FIG. 2.

This conductor containing paste was a silver-lead paste and containing 7.5 parts by weight of metal oxides comprising lead oxide (5% by weight), zinc oxide (55% by weight), silica (10% by weight), boron oxide (25% by weight) and alumina (5% by weight) per 100 parts by weight of silver. The silver particles had an average particle diameter of 4.5 $\mu$m, and were scaly.

(5) Next, the heater plate 31 on which the conductor containing paste was printed was heated and fired at 780° C. to sinter silver and lead in the conductor containing paste and bake them onto the heater plate 31. Thus, heating elements 32 were formed. The silver-lead heating elements 32 had a thickness of 5 $\mu$m, a width of 2.4 mm and a area resistivity of 7.7 mΩ/□.

(6) The heater plate 31 formed in the step (5) was immersed into an electroless nickel plating bath comprising an aqueous solution containing 80 g/L of nickel sulfate, 24 g/L of sodium hypophosphite, 12 g/L of sodium acetate, 8 g/L of boric acid, and 6 g/L of ammonium chloride to precipitate a metal covering layer (nickel layer) 38 having a thickness of 1 $\mu$m on the surface of the silver-lead heating elements 32.

(7) A silver-lead solder paste (made by Tanaka Kikinzoku Kogyo CO.) was printed by screen printing on portions to which terminal for attaining connection to a power source were attached, to form a solder layer.

Next, terminal pins 33 made of Kovar were put on the solder layer and heated at 420° C. for reflowing to attach the terminal pins 33 onto the surface of the heating elements 32.

(8) Next, thermocouples for temperature-control were fitted in the bottomed holes 34 and then they were fixed by embedding a ceramic adhesive agent (made by Toagosei Co., Ltd., Aron ceramic) to obtain a ceramic heater 30.

(Example 2)

Manufacture of a Ceramic Heater made of Silicon Carbide

A ceramic heater made of silicon carbide was manufactured in the same way as in Example 1 except that silicon carbide having an average particle diameter of 1.0 $\mu$m was used, sintering temperature was set to 1900° C., and the surface of the resultant heater plate was fired at 1500° C. for 2 hours to form a $SiO_2$ layer having a thickness of 1 $\mu$m on the surface.

(Example 3)

Manufacture of a Ceramic Heater having Heating Elements inside thereof. (FIGS. 1 to 2)

(1) A paste obtained by mixing aluminum nitride powder (made by Tokuyama Corp., average particle diameter: 1.1 $\mu$m), 4 parts by weight of yttria (average particle diameter: 0.4 $\mu$m), 11.5 parts by weight of an acrylic binder, 0.5 part by weight of a dispersant, and 53 parts by weight of alcohols comprising 1-butanol and ethanol was formed into a green sheet having a thickness of 0.47 $\mu$m by the doctor blade process.

(2) Next, this green sheet was dried at 80° C. for 5 hours, and was subjected to punching to make portions for through holes 15 having diameters of 1.8 mm, 3.0 mm and 5.0 mm, respectively, into which silicon wafer lifter pins are inserted, and portions for conductor filled through holes for connection to terminal pins.

(3) Hundred parts by weight of tungsten carbide particles having an average particle diameter of 1 $\mu$m, 3.0 parts by weight of an acrylic binder, 3.5 parts by weight of α-terpineol solvent, and 0.3 part by weight of a dispersant were mixed to prepare a conductor containing paste A.

Hundred parts by weight of tungsten particles having an average particle diameter of 3 $\mu$m, 1.9 parts by weight of an acrylic binder, 3.7 parts by weight of α-terpineol solvent, and 0.2 part by weight of a dispersant were mixed to prepare a conductor containing paste B.

The conductor containing paste A was printed on the green sheet by screen printing, to form a conductor containing paste layer. The printed pattern was made to a pattern of concentric circles as shown in FIG. 2. The conductor containing paste B was filled into the through holes which would be conductor filled through holes for connection to terminal pins.

Thirty seven green sheets on which no tungsten paste was printed were stacked on the upper side (wafer-heating face) of the green sheet subjected to the above-mentioned treatment, and 13 green sheets on which no tungsten paste was printed were stacked on the lower side thereof, and then the green sheets were laminated at 130° C. and a pressure of 80 MPa.

(4) Next, the resultant lamination was degreased at 600° C. in nitrogen gas for 5 hours, and hot-pressed at 1890° C. and a pressure of 15 MPa for 3 hours to obtain an aluminum nitride plate 3 mm in thickness. This was cut out into a disc of 230 mm in diameter to prepare a ceramic heater having therein heating elements having a thickness of 6 $\mu$m and a width of 10 mm (5) Next, the plate obtained in the step (4) was grinded with diamond grindstone, and then a mask was put thereon to make bottomed holes 14 (diameter: 1.2 mm, and depth: 2.0 mm) for thermocouples in the surface by blast treatment with SiC and the like.

(6) Furthermore, a part of the through holes which would be conductor filled through holes was hollowed out, and a gold solder comprising Ni—Au was employed and heated for reflowing at 700° C., so as to connect terminal pins 13 made of Kovar to the concave portions.

Regarding the connection of the terminal pins 13, a structure, wherein a support of tungsten supports at three points, is desirable. This is because the reliability of the connection can be kept.

(8) Next, a pluralities of thermocouples 17 for temperature-control were buried in the bottomed holes to finish the manufacture of the ceramic heater 10.

(Example 4)

Control of the Temperature of a Ceramic Heater (1) A temperature-adjusting equipment (made by Omron Corp., E5ZE) equipped with a control unit having a power source, a memory unit, and an operation unit was prepared. Then, the wirings from the control unit 43 were connected to the ceramic heater 30 (reference to FIG. 3) manufactured in Example 1 through the terminal pins 13, and a silicon wafer was put on this ceramic heater 30.

Incidentally, although not shown in FIG. 3, the bottomed holes 34*a* to 34*c* are formed at the same position of the bottomed holes 14*a* to 14*c* of the ceramic heater 10 shown in FIG. 2. Also, the heating elements 32*a* to 32*c* are formed at the same position of the heating elements 12*a* to 12*c* of the ceramic heater 10 shown in FIG. 2.

(2) Next, a voltage was applied to this ceramic heater 30, and the temperature thereof was once raised to 200° C. Furthermore, the temperature was further raised up to 200° C. to 400° C., and then the temperature was measured with the thermocouples equipped in the bottomed holes 34*a* to 34*c*. The measured results are shown in FIG. 4.

Figure 4:
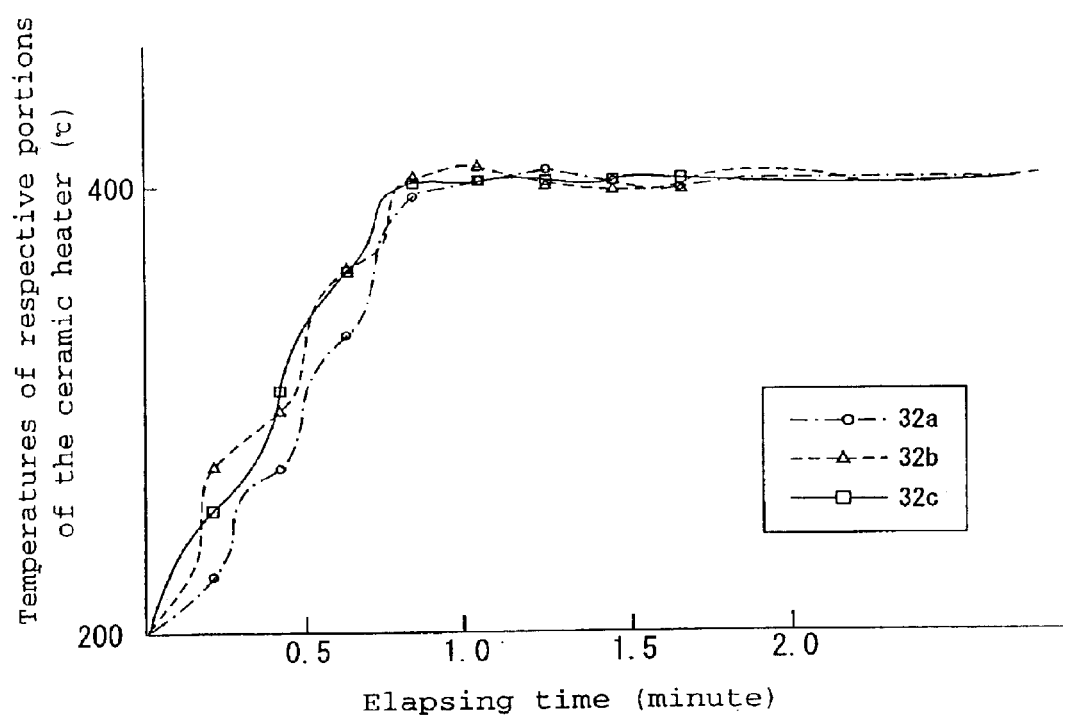
FIG. 4 is a graph showing temperature profiles of a ceramic heater according to Example 4.
Figure 5:
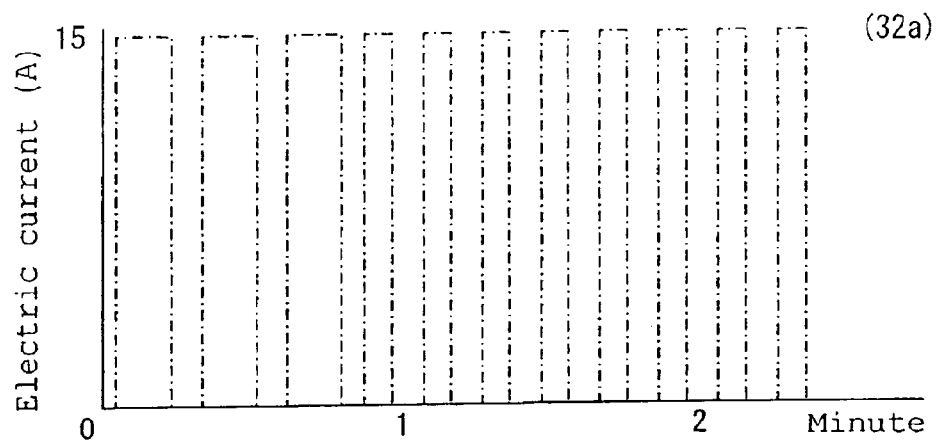
FIG. 5 is a graph showing electric power (electric current) profiles of a ceramic heater according to Example 4.
Figure 5:
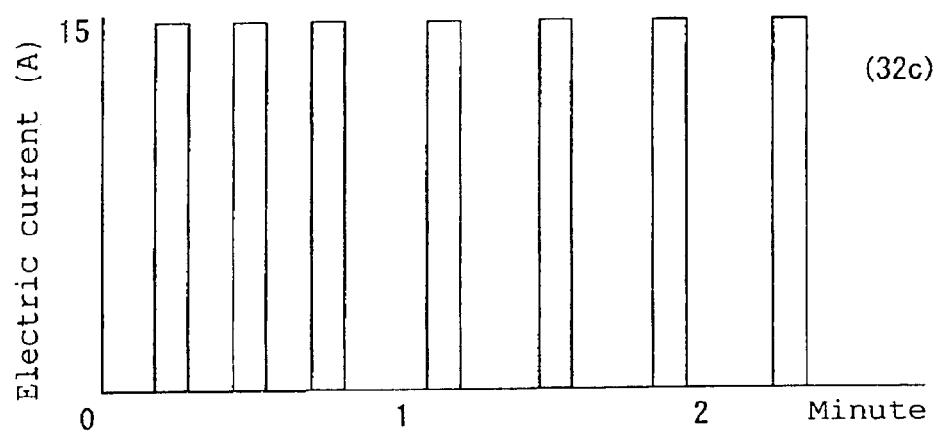
Figure 5:
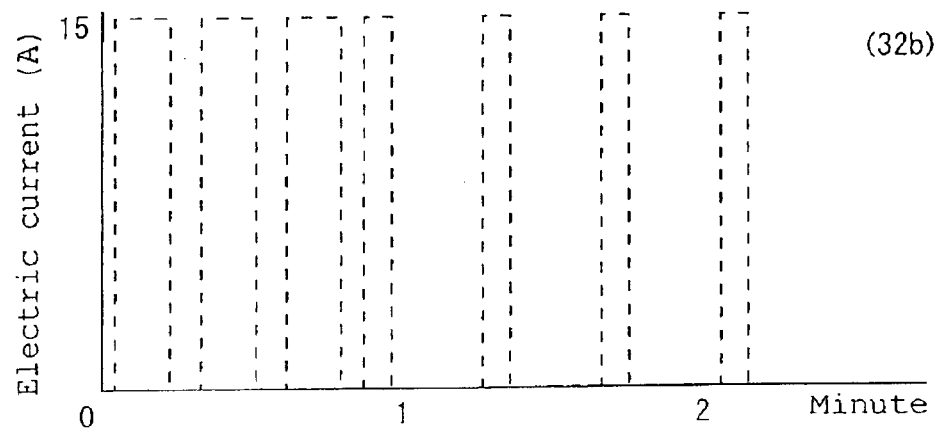

Profiles of electric powers (represented by current values) supplied to the heating elements 32*a*, 32*b* and 32*c* are shown in FIG. 5. In FIG. 4, the vertical axis represents temperature and the horizontal axis represents elapsing time. In FIG. 5, the vertical axis represents current value, and the horizontal axis represents time.

As obvious from FIG. 4, after the current started to be applied to the ceramic heater 30, the temperature of the ceramic heater becomes even in a short period of time. As a result, the silicon wafer put on this ceramic heater 30 was not damaged in the process of the heating, and was evenly heated.

Figure 8:
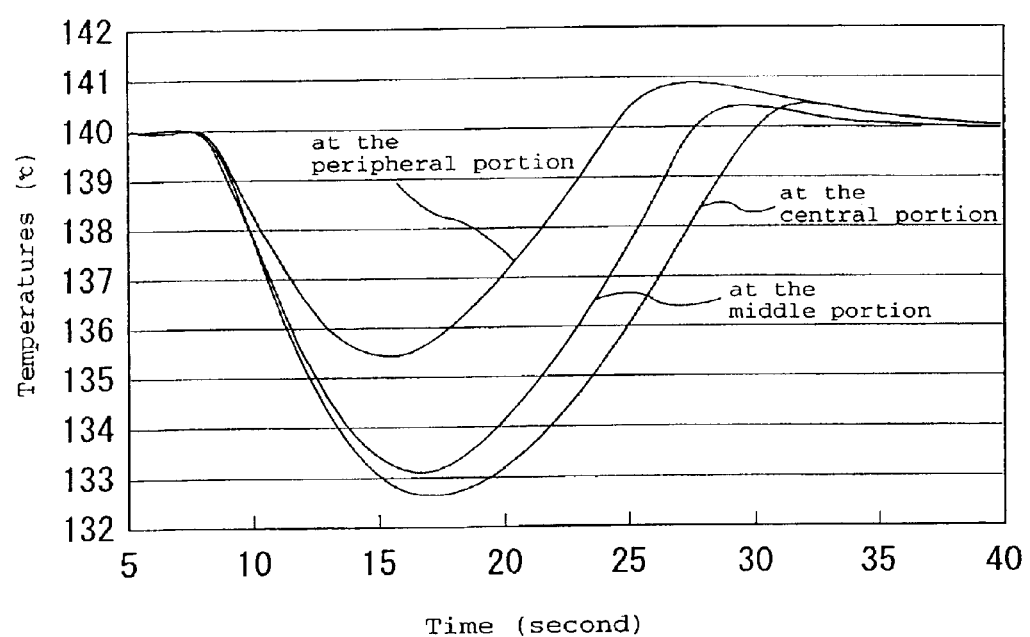
FIG. 8 is a graph showing the state of the temperature recovery of the ceramic heater when a disturbance occurred on the surface of the ceramic substrate according to Example 4.

Also, after heated up to 140° C., the state of recovery of the temperature at the central portion, middle portion and peripheral portion of the ceramic heater 30, under such circumstance that the silicon wafer of 25° C. is put thereon, was examined, and shown in FIG. 8.

Also, as obvious from the result shown in FIG. 8, the temperature of the ceramic heater 30 can be controlled to the original temperature in significantly short period of time even if a disturbance is generated by abruptly putting a silicone wafer with low temperature thereon.

Also, when the similar temperature control is conducted by using the ceramic heater obtained in the examples 2 and 3, the silicone wafer is evenly heated similarly to the above-mentioned case.

(Example 5)

The Temperature Control by the Thermoviewer (1) A temperature-adjusting equipment (made by Omron Corp., E5ZE) equipped with a power source unit 630, a control unit 63, a memory unit 61, and an operation unit 62 was prepared. Then, through the terminal pins 33, the wirings from the control unit 63 is connected to the manufactured heater plate 51 (ceramic heater 50, reference to FIG. 6) which had the similar structure to that of the case of Example 1 except that the bottomed holes for inserting the thermocouples were not formed threon. And then, the wiring from the thermoviewer 600 (made by Japan Datum Inc., IR162012-0012) was connected to the personal computer (FUJITSU Co.Ltd FM-V) which plays both roles of the memory unit 610 and the operation unit 620.

The software for image processing (made by Cognex corporation)is installed in the personal computer. The image processing software sections the screen of the thermoviewer 600 into 10000 pixels, then the color of the sectioned pixels is subjected to the multi-level judgment and valued in multiple steps of 0 to 9. When plural colors exist in the section, the average value thereof is adopted. The average value of the temperature controlled area is obtained from the figures thus obtained by multi-level judgment. The temperature is determined from the color corresponding to the average value. Then, thus determined temperature of respective temperature controlled areas is transmitted to the temperature-adjusting equipment.

Figure 9:
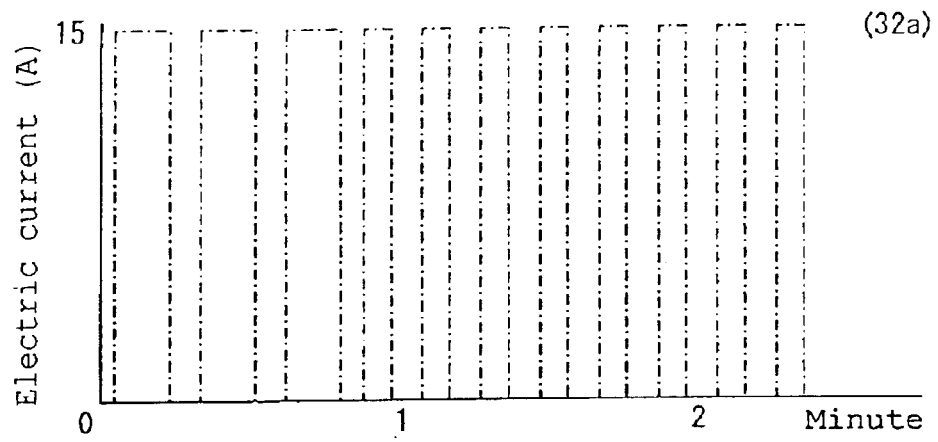
FIG. 9 is a graph showing electric power (electric current) profiles of a ceramic heater according to Example 5.
Figure 9:
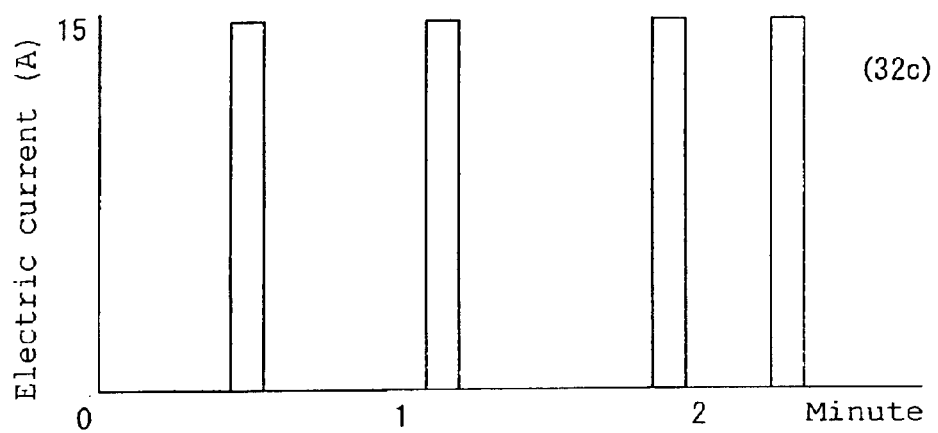
Figure 9:
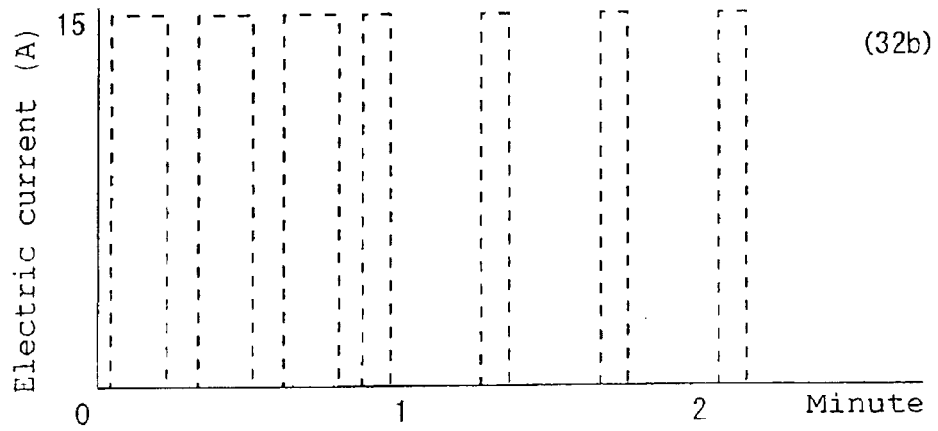

(2) Next, a voltage was applied to this ceramic heater 50, and the temperature thereof was once raised to 200° C. Profiles of electric powers (represented by current values) supplied to the heating elements 32*a*, 32*b* and 32*c* are shown in FIG. 9. Further, the result of the temperature measurement is shown in FIG. 10.

Figure 10:
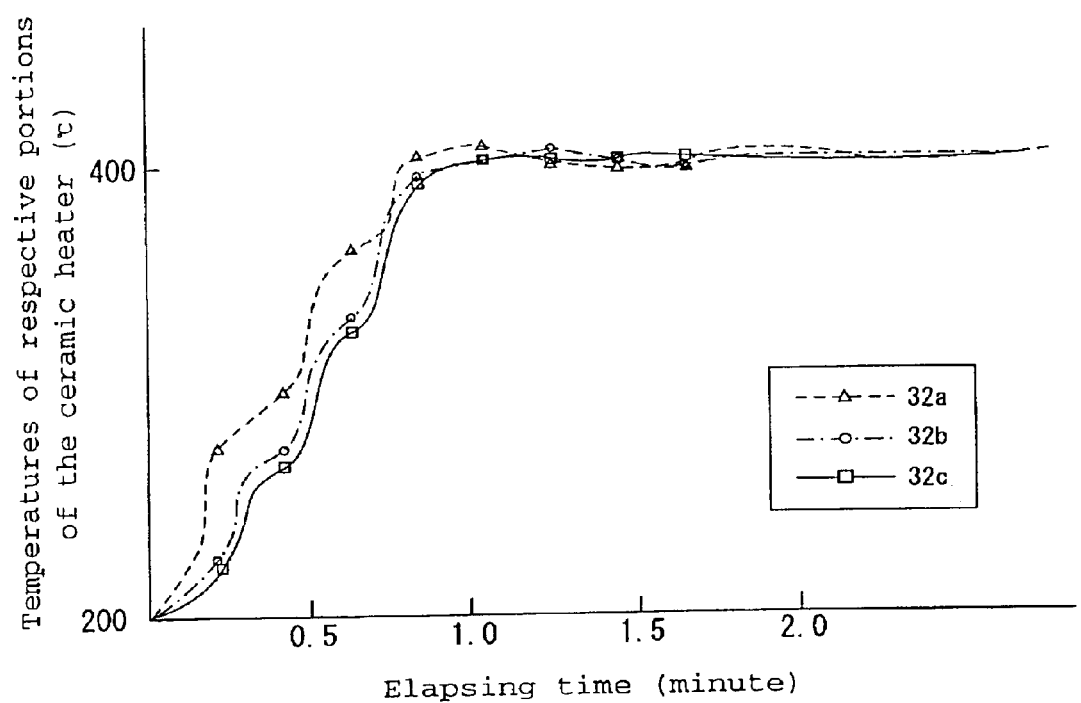
FIG. 10 is a graph showing temperature profiles of a ceramic heater according to Example 5.

As obvious from FIG. 10, after the current started to be applied to the ceramic heater 50, the temperature of the ceramic heater became even in a short period of time. As a result, the silicon wafer put on this ceramic heater 50 was not damaged in the process of the heating, and was evenly heated.

INDUSTRIAL APPLICABILITY

As described above, according to the ceramic heaters of the present invention, by making the temperature of the wafer-heating face even, the wafer-heating face for an object to be heated can be made even, the whole temperature of the object to be heated such as a semiconductor wafer and the like is made even, the damage of the semiconductor wafer is prevented. Also, the temperature control can be successfully conducted even in the case the unexpected temperature change occurs, and thus the present invention is significantly profitable.

What is claimed is:

1. A ceramic heater for heating a semiconductor wafer, comprising:
    a ceramic substrate having a first surface and a second surface, the first surface being arranged as a heating face configured to heat the semiconductor wafer;
    a resistance heating element formed on the second surface of said ceramic substrate or inside said ceramic substrate, and including at least two circuits;
    temperature-measuring means for measuring a temperature of said ceramic substrate or a temperature of the semiconductor wafer;
    a control unit configured to supply electric power to said resistance heating element;
    a memory unit configured to store the temperature data measured by said temperature-measuring means; and
    an operation unit configured to calculate, based on said temperature data, electric power data required for said resistance heating element to attain a uniform temperature of the heating face, wherein different electric power is supplied to each of the at least two circuits based on the calculated electric power data.

2. A ceramic heater for heating a semiconductor wafer, comprising:
    a ceramic substrate having a first surface and a second surface, the first surface being arranged as a heating face configured to heat the semiconductor wafer;
    a resistance heating element formed on the second surface of said ceramic substrate or inside said ceramic substrate, and including at least two circuits;
    temperature-measuring means for measuring a temperature of said ceramic substrate or a temperature of the semiconductor wafer;
    a power source configured to supply electric power to said resistance heating element;
    a control unit configured to control the power source;
    a memory unit configured to store the temperature data measured by said temperature-measuring means; and
    means for calculating, based on said temperature data, electric power data required for said resistance heating element to attain a uniform temperature of the first surface,
    wherein different electric power is supplied to each of the at least two circuits based on the calculated electric power data.

3. The ceramic heater for heating a semiconductor wafer according to claim 1, wherein said temperature-measuring means comprises a temperature-measuring element.

4. The ceramic heater for heating a semiconductor wafer according to claim 1, wherein said temperature-measuring means comprises a thermoviewer.

5. The ceramic heater for heating a semiconductor wafer according to claim 2, wherein said temperature-measuring means comprises a temperature-measuring element.

6. The ceramic heater for heating a semiconductor wafer according to claim 2, wherein said temperature-measuring means comprises a thermoviewer.

7. The ceramic heater for heating a semiconductor wafer according to claim 1, wherein said ceramic substrate comprises a nitride ceramic or a carbide ceramic.

8. The ceramic heater for heating a semiconductor wafer according to claim 1, wherein said temperature-measuring means comprises a thermocouple.

9. The ceramic heater for heating a semiconductor wafer according to claim 1, wherein said ceramic heater comprises plural temperature-measuring means.

10. The ceramic heater for heating a semiconductor wafer according to claim 2, wherein said ceramic substrate comprises a nitride ceramic or a carbide ceramic.

11. The ceramic heater for heating a semiconductor wafer according to claim 2, wherein said temperature-measuring means comprises a thermocouple.

12. The ceramic heater for heating a semiconductor wafer according to claim 2, wherein said ceramic heater comprises plural temperature-measuring means.

13. The ceramic heater of claim 1, further comprising:
    a lifter pin configured to support the semiconductor wafer above and away from the heating face when the semiconductor wafer is heated by the heating face.

14. The ceramic heater of claim 2, further comprising:
    means for supporting the semiconductor wafer above and away from the heating face when the semiconductor wafer is heated by the heating face.

15. A method for heating a semiconductor wafer, comprising:
    positioning the semiconductor wafer above a ceramic substrate, the ceramic substrate having a first surface and a second surface, and the first surface being arranged as a heating face configured to heat the semiconductor wafer, heating the heating face with at least two heating circuits formed on the second surface of the ceramic substrate or inside the ceramic substrate;

heating the semiconductor wafer with the heating face;

obtaining temperature data associated with a temperature of the ceramic substrate or a temperature of the semiconductor wafer;

calculating, based on the temperature data, electric power data associated with attaining a uniform temperature of the heating face; and supplying different electric power to each of the at least two heating circuits based on the electric power data.

16. The method of claim 15, wherein, the positioning includes supporting the semiconductor wafer at a distance above the heating face, and the heating of the semiconductor wafer includes heating the semiconductor wafer when the semiconductor wafer is supported at the distance above the heating face.

17. The method of claim 15, wherein the obtaining includes measuring the temperature of the ceramic substrate with at least one thermocouple.

18. The method of claim 15, wherein the obtaining includes optically measuring the temperature of the semiconductor wafer.

* * * * *